United States Patent [19]

Miller

[11] Patent Number: 4,916,387

[45] Date of Patent: Apr. 10, 1990

[54] OPTICAL SYSTEM FOR A FARADAY EFFECT CURRENT SENSOR

[75] Inventor: Robert C. Miller, Salem Twp., Westmoreland County, Pa.

[73] Assignee: Asea Brown Boveri, Inc., Purchase, N.Y.

[21] Appl. No.: 260,849

[22] Filed: Oct. 21, 1988

[51] Int. Cl.$^4$ .................. G01R 31/00; G01R 33/00; G01J 1/32

[52] U.S. Cl. ..................... 324/96; 324/117 R; 324/244; 250/225; 250/227.21; 250/551

[58] Field of Search ............... 324/96, 117 R, 117 H, 324/244; 250/205, 225, 227; 350/375, 376, 96.15; 455/609, 610, 612

[56] References Cited

U.S. PATENT DOCUMENTS

| | | | |
|---|---|---|---|
| 4,540,937 | 3/1985 | Asars | 324/96 |
| 4,683,421 | 7/1987 | Miller et al. | 324/117 R |
| 4,704,741 | 11/1987 | Shikada | 455/612 |
| 4,748,686 | 5/1988 | Glomb | 324/96 |
| 4,829,821 | 5/1989 | Carome | 250/227 |

Primary Examiner—Reinhard J. Eisenzopf
Assistant Examiner—Vinh P. Nguyen
Attorney, Agent, or Firm—B. R. Studebaker

[57] ABSTRACT

A system for monitoring an alternating current including: a current transducer (10) having first and second optical ports (12,14) and a component for causing optical radiation to travel between the optical ports (12,14) while interacting with the alternating current in a manner to cause the intensity of the optical radiation to vary as a function of variations in the amplitude of the current, with the polarity of the variation being dependent on the direction of travel of optical radiaiton in the transducer (10) between the optical ports (12,14); two optical cables (16,18) each optically coupled to a respective optical port; couplers (20,22) connected to the optical cables (16,18) for causing optical radiation to travel in both directions in the transducer (10) between the optical ports (12,14); and a circuit arrangement (24,26,28,30,38,40,52) for deriving a respective representation of the change in intensity experienced by the optical radiation traveling in each direction through the cables (16,18) and the transducer (10), and for combining the representations relating to both directions in order to derive an indication of the change in intensity experienced by the optical radiation when traveling through the transducer (10).

8 Claims, 1 Drawing Sheet

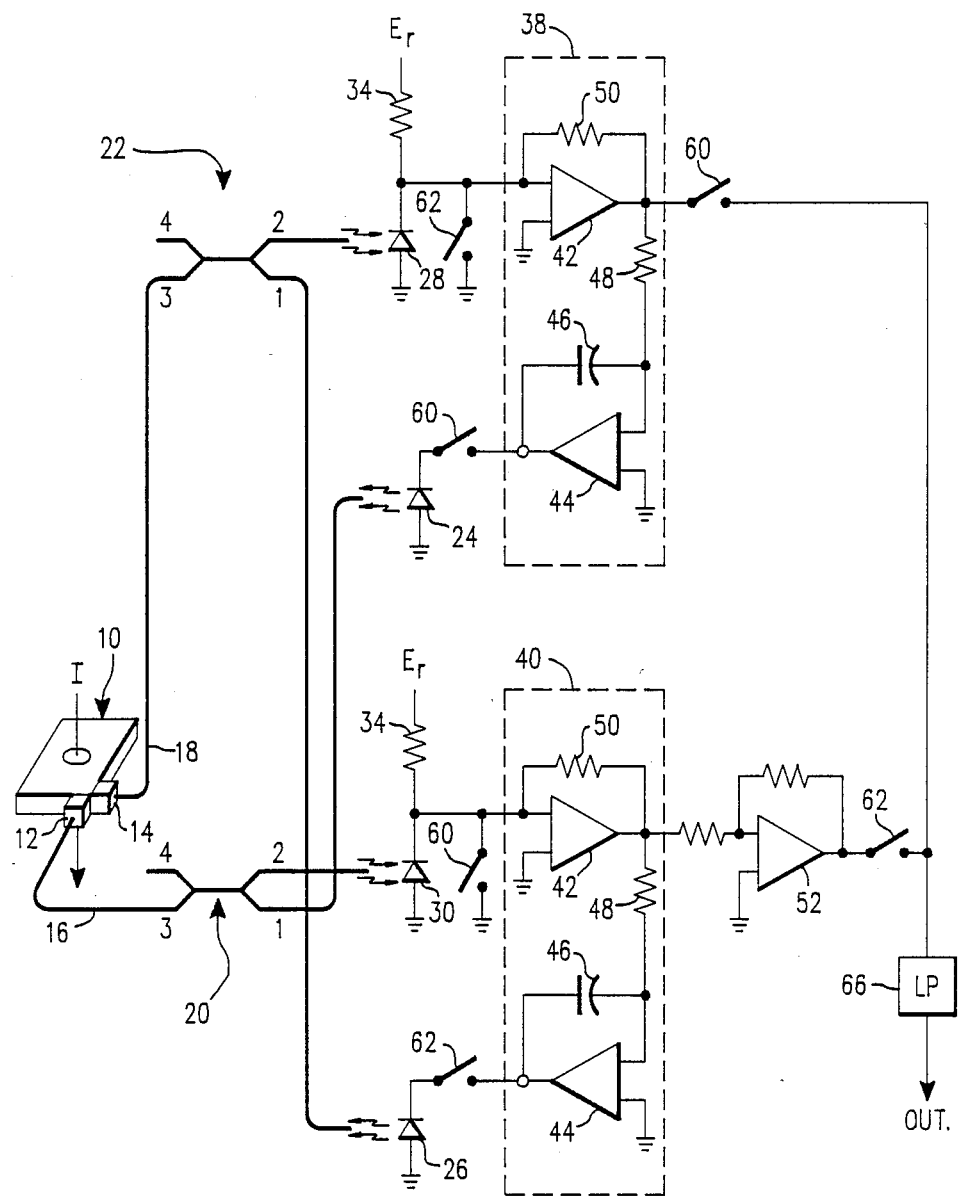

OPTICAL SYSTEM FOR A FARADAY EFFECT CURRENT SENSOR

BACKGROUND OF THE INVENTION

The present invention relates to current measuring systems employing a Faraday Effect current sensor.

Current sensors of this type are composed of a body of magneto-optic material provided with an opening through which extends a conductor carrying a current to be measured. The sensor further includes two polarizers which, together with the magneto-optic material, defines a light conduction path which extends around the conductor. Light radiation traversing this path experiences an intensity variation which is proportional to the instantaneous amplitude (positive or negative) of the current. Therefore, by comparing the intensities of the light radiation at the input and output of the light conduction path, it is possible to obtain a current measurement.

Typically, the light radiation is generated by a light-emitting element and received by a photodetector, each of which is coupled to one end of the light conducting path of the sensor by a respective fiber-optic cable. The light emitting element and the photodetector are electrically connected to form part of a suitable signal processing circuit.

While such a system is generally capable of providing a good current measurement, it is frequently desired to employ the system in environments in which the fiber-optic cables would be subjected to physical movements, such as shaking or vibrations, which will give rise, in the fiber-optic cables, to light intensity variations having frequency components comparable to the frequency of the current being monitored. Such intensity variations will significantly impair the accuracy of the current measurement.

SUMMARY OF THE INVENTION

It is an object of the present invention to eliminate, or at least substantially reduce the severity of, the problem described above.

A more specific object of the present invention is to significantly reduce the adverse effects of cable movements on the accuracy of the resulting current measurement.

A more specific object of the invention is to provide an arrangement which substantially reduces signal noise components created by such cable movements.

The above and other objects are achieved, according to the present invention, by a system for monitoring an alternating current comprising: a current transducer having first and second optical ports and means for causing optical radiation to travel between the ports while interacting with the alternating current in a manner to cause the intensity of the optical radiation to vary as a function of variations in the amplitude of the current, with the polarity of the variation being dependent on the direction of travel of optical radiation in the transducer between the optical ports; two optical cables each optically coupled to a respective optical port; light coupling means connected to the optical cables for causing optical radiation to travel in both directions in the transducer between the optical ports; and circuit means coupled to the light directing means for deriving a respective representation of the change in intensity experienced by the optical radiation traveling in each direction through the cables and the transducer, and for combining the representations relating to both directions in order to derive an indication of the change in intensity experienced by the optical radiation when traveling through the transducer.

BRIEF DESCRIPTION OF THE DRAWING

The sole FIGURE is a diagram illustrating a preferred embodiment of the present invention associated with a Faraday Effect current sensor

DESCRIPTION OF THE PREFERRED EMBODIMENTS

The FIGURE shows a preferred embodiment of a circuit according to the invention for measuring the magnitude of a current, I, flowing through a magnetooptical current transducer, or Faraday Effect current sensor, 10. Devices of this type are well known in the art and are commercially available.

Transducer 10 includes two bidirectional optical ports 12 and 14, each coupled to a respective optical cable 16 or 18, and a known arrangement of collimating lenses, polarizers, magneto-optic material and light directing elements for causing a light beam to be deflected around current I while being varied to an extent dependent on the current amplitude and the orientation of the polarization axes of the polarizers. For example, if two polarizers are provided with their polarization axes oriented at 45' to one another, and the light beam, after being influenced by current I, is applied to a photodiode, the photodiode signal, S, is equal to $S_0(1+2VI)$ if the light travels in one sense around current I, and $S_0(1-2VI)$, if the light travels in the other sense, where $S_o$ is the photodiode signal when I=O and V is the Verdet constant in radians/amp-turn when I is expressed in amperes.

If current I is a sinusoidal alternating current such that $I=I_o \sin(wt)$, then S can be separated into a DC component, $S_{DC}=S_o$; and an AC component, $S_{AC}=-2S_oVI$, so that $$I = \pm S_{AC}/2VS_{DC}.$$

According to the invention, any noise components introduced into the light signal due to cables 16 and 18 are cancelled by alternating the direction of travel of the light radiation through sensor 10 at a rate which is high compared to w.

For this purpose, each cable 16 and 18 is connected to one port 3 of a respective optical directional coupler 20, 22. Each port 3 is optically coupled to two ports 1 and 2 and, each port 1 is connected to a light-emitting diode 24 or 26, and each port 2 is connected to a respective photodiode 28 or 30.

Each coupler 20 and 22 can be symmetrical, i.e., light arriving at any one terminal is divided equally between the two opposite terminals. However, it is preferred that the couplers by asymmetrical, with arriving light being divided between opposite terminals in a ratio of 1:2 to 1:3 and the smaller fraction being directed to port 1 or 4.

Each photodiode 28, 30 is connected to a source of reference voltage $E_r$ via a respective bias resistor 34 and the voltage across each photodiode is applied across the inputs of a respective circuit 38 or 40, each circuit being composed of a first differential amplifier 42 and a second differential amplifier 44 provided with a feedback connected capacitor 46 and a coupling resistor 48 to constitute an integrator. The inverting input of amplifier 44 is connected to the output of amplifier 42 via the coupling resistor 48.

Each amplifier includes a feedback resistor 50 and has its inverting input connected to the point of connection between a resistor 34 and an associated photodiode 28 or 30 so that the output voltage from each amplifier 42 will be $$e_{out} = \pm 2VIE_r(R50/R34)$$

on the condition that $w \gg 1/C46.R48$ and $w_{noise} \ll 1 C46.R48$.

Each integrator 44, 46 produces an output proportional to the time integral of the d.c. component at the output of the associated amplifier 42 to drive an associated LED 24 or 26, and will act to cause the output of its associated LED 24 or 26 to maintain the d.c. component of the signal provided by the associated photodiode constant so that $S_{DC}$ need not be considered.

Circuits 38 and 40 are known, per se. A suitable example of such circuits is disclosed in U.S. Pat. No. 4,540,937, issued to Juris A. Asars on Sept. 10, 1985.

The output of amplifier 42 of circuit 40 is connected to an invertor 52 and the device is completed by two sets of switches 60 and 62 that will be operated at a frequency which is substantially higher than the highest frequency component of interest in current I in a manner such that switches 60 operate in phase opposition to switches 62.

Thus, during one-half of each switching cycle, with switches 60 closed and switches 62 open, light travels from LED 24 to photodiode 28 via cable 16, port 12, port 14 and cable 18. During the other half of each switching cycle, light travels from LED 26 to photodiode 30 via cable 18, port 14, port 12 and cable 16.

In the event a noise component, $e_{noise}$, originates in either one of cables 16 and 18, the output signal from circuit 38 during each half cycle when switches 60 are closed, will be $e_{noise}+2VIE_r(R50/R34)$ and the output signal from circuit 40 during each half cycle when switches 62 are closed will be $e_{noise}-2VIE_r(R50/R34)$, the negative sign resulting from the sign inversion occurring upon reversal of the direction of light travel through transducer 10. Therefore, by applying the output from circuit 40 to invertor 52, the signals applied to a low pass filter 66 during alternate half cycles of the switching sequence will contain $+e_{noise}$ and $-e_{noise}$ components which can be suppressed by giving filter 66 a cutoff frequency below the switching frequency. This is easily achieved because that frequency is made substantially higher than the frequency components of interest in current I.

According to an alternative embodiment of the invention, switches 60 and 62 can be eliminated and the outputs of circuit arrangement 38 and amplifier 52 can be permanently connected to filter 66, so that light radiation flows simultaneously in both directions through sensor 10 and the resulting output signals are combined in a summing amplifier (not shown) whose output is connected to filter 66. Satisfactory operation of this alternative embodiment requires only that reflections in the optical system, and particularly at each end of each coupler 20, 22, be kept very small.

The invention could also be implemented with electronic circuitry employing dividers, if needed, to compensate for variations in the d.c. component of the signal from each photodetector.

While the description above shows particular embodiments of the present invention, it will be understood that many modifications may be made without departing from the spirit thereof. The pending claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A system for monitoring an alternating current comprising: a current transducer having first and second optical ports and means providing a light conductive path for causing optical radiation to travel between said optical ports while interacting with the alternating current in a manner to cause the intensity of the optical radiation to vary as a function of variations in the amplitude of the current, with the polarity of the variation being dependent on the direction of travel of optical radiation in said transducer between said optical ports; two optical cables each optically coupled to a respective optical port; light directing means connected to said optical cables for causing optical radiation to travel in both directions in said transducer between said optical ports; and circuit means coupled to said light directing means for deriving a respective representation of the change in intensity experienced by the optical radiation traveling in each direction through said optical cables and said transducer, and for combining the representations relating to both directions in order to derive an indication of the change in intensity experienced by the optical radiation when traveling through said transducer.

2. A system as defined in claim 1 wherein: said circuit means comprise two circuit arrangements each having a light emitting element and light-to-electrical signal conversion means for producing an electrical signal proportional to the intensity of light incident thereon; and said light directing means comprise optical coupling means for coupling each of said optical ports to said light emitting element of a respective one of said circuit arrangements and to said conversion means of the other one of said circuit arrangements.

3. A system as defined in claim 2 wherein said circuit means further comprise signal combining means connected to said two circuit arrangements for deriving an output signal representative of the difference between the electrical signals produced by said conversion means of said two circuit arrangements.

4. A system as defined in claim 3 wherein said signal combining means comprise:
an invertor connected to one of said circuit arrangements for inverting the polarity of the electrical signal produced by said conversion means of said one circuit arrangement; and
low-pass filter means connected to receive the electrical signal produced by said conversion means of the other one of said circuit arrangements and the inverted signal produced by said invertor for forming an output signal constituting a combination of the signals received by said low-pass filter means.

5. A system as defined in claim 2 wherein said optical coupling means comprise two optical couplers each having first, second and third coupling ports, with said third coupling port being in light conducting communication with each of said first and second coupling ports, said third coupling port of each said optical coupler being coupled to a respective optical port of said transducer, and said first and second coupling ports of each said coupler being coupled, respectively, to said light-emitting element of a respective one of said circuit arrangements and to said conversion means of the other one of said circuit arrangements.

6. A system as defined in claim 5 wherein said circuit means further comprise time multiplex means connected for operating said circuit arrangements in time alternation at a rate higher than the frequency of the alternating current.

7. A system as defined in claim 5 wherein said circuit arrangements are connected to operate simultaneously.

8. A system as defined in claim 1 wherein said circuit means comprise combining means for forming an output signal representative of the difference between the representations relating to the two directions of travel of optical radiation in said transducer.

* * * * *